United States Patent [19]
Rose et al.

[11] Patent Number: 4,801,814
[45] Date of Patent: Jan. 31, 1989

[54] PULSE GENERATOR

[75] Inventors: Jochen Rose, Rothenbach; Wolfgang Rosl, Eckenthal, both of Fed. Rep. of Germany

[73] Assignee: Standard Elektrik Lorenz AG, Stuttgart, Fed. Rep. of Germany

[21] Appl. No.: 939,204

[22] Filed: Dec. 8, 1986

[30] Foreign Application Priority Data

Dec. 11, 1985 [DE] Fed. Rep. of Germany ....... 3543652

[51] Int. Cl.$^4$ ........................ H03K 3/00; H01H 19/58

[52] U.S. Cl. ................................ 307/106; 307/132 R; 200/11 R; 200/501

[58] Field of Search ........... 307/106, 107, 108, 132 R, 307/132 M, 96, 97; 200/11 R, 153 P, 153 LB, 80, 153 N, 11 G

[56] References Cited

U.S. PATENT DOCUMENTS

| | | | |
|---|---|---|---|
| 2,981,854 | 4/1961 | Grace et al. | 307/132 R |
| 4,282,415 | 8/1981 | Shimizu et al. | 200/11 G |
| 4,626,699 | 12/1986 | Oesterle et al. | 307/106 |

FOREIGN PATENT DOCUMENTS

| | | |
|---|---|---|
| 3120598 | 3/1982 | Fed. Rep. of Germany . |
| 3136598 | 3/1983 | Fed. Rep. of Germany . |

*Primary Examiner*—Shoop, Jr. William M.
*Assistant Examiner*—Sharon D. Logan
*Attorney, Agent, or Firm*—Christie, Parker & Hale

[57] ABSTRACT

A pulse generator is disclosed comprising a toothed disk which is rotatable with a rotary shaft and is capable of actuating at least two contact pairs for generating pulses and for sensing the direction of rotation of the rotary shaft via a rocker engaging the teeth of the toothed disk by means of a mating portion, the rocker being deflectable in different directions depending on the direction of rotation of the rotary shaft, the mating portion being movable out of engagement with a tooth space and into engagement with the following tooth space, and at least one contact spring of each contact being capable of being actuated in the range of the maximum deflections and prior to the return movement. The rocker (18) is designed as a separate component part and has a bearing hole (20) for a swivel shaft (17) on which it is pivoted, that the contact springs (11, 12) are disposed beside; below or above the rotary shaft (27) and the rocker (18) essentially in the direction of the connecting line (19) between the axis (15) of the rotary shaft (27) and the swivel shaft (17) of the rocker (18), that the rocker (18) has lateral actuating arms (28) capable of actuating the contact springs (11, 12), and that a detent arrangement (23, 24, 25, 26) is provided which resiliently locks the rocker (18) or the toothed disk (16) in the rest position. A compact design is thus obtained.

16 Claims, 1 Drawing Sheet

PULSE GENERATOR

FIELD OF THE INVENTION

The present invention relates to a pulse generator for producing electrical contact closure pulses in response to the rotation of a shaft.

BACKGROUND OF THE INVENTION

A pulse generator is disclosed in DE-OS No. 31 36 598. Its set of contact springs consists of three contact springs arranged parallel in relation to each other, which are all attached at one end and have contacts on the free ends. The central contact spring is extended and projects into the toothed rim of a toothed disk. Depending on the rotation of the toothed disk, the central contact spring is pressed towards one or the other outer contact spring and thus closes the contacts associated with each other. After actuating the contact, the free end of the central contact spring jumps into the following tooth space, thus opening the contact. During the rotation of the toothed disk, a pulse repetition is issued due to contact closures, and the number of contact closure pulses is proportional to the angle of rotation. In this kind of pulse generator, the contact springs and the toothed disk are aligned in relation to each other; and this results in a correspondingly great overall length.

SUMMARY OF THE INVENTION

It is an object of the present invention to provide a pulse generator for producing electrical contact closure pulses which is reliable in operation and of a more compact construction design than prior designs.

This object is achieved by features including a pivotable rocker which engages a toothed wheel and transfers actuation motion to a pair of spring switch contacts on opposite sides of the toothed wheel. While the overall length of the pulse generator is considerably reduced over prior designs, the housing has to be designed only slightly wider if the contact springs and the toothed disk are arranged side by side. In addition, this provides greater freedom in the design and arrangement of the contacts and in the selection of the points where the force of actuating arms on the rocker act on the contact springs.

DESCRIPTION OF THE PREFERRED EMBODIMENTS

Figure 1:
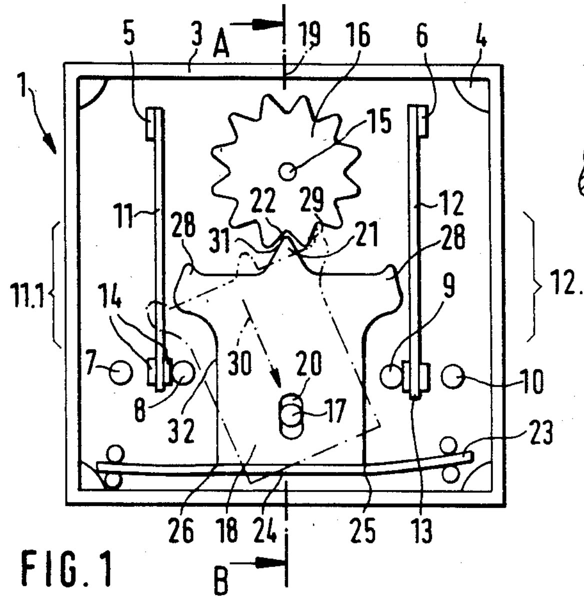
FIG. 1 is a top view of a pulse generator with the cover open or transparent.
Figure 2:
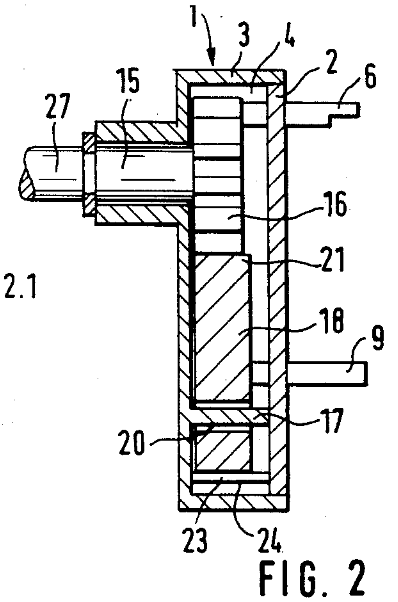
FIG. 2 is a section taken along line A-B of FIG. 1, but without a section through the toothed disk.

Referring first to FIGS. 1 and 2, the housing 1 of a pulse generator consists of a bottom member 2 and a preferably tub-shaped or box-shaped cover member 3. In the cover member 3, bearing surfaces 4 may be provided for supporting the bottom member 2.

Fixed electrical contacts 5, 6, 7, 8, 9, 10 are provided, preferably in the bottom member 2, which project outwards as connecting elements. The contacts are inserted into or intergrally formed with the bottom member 2, with two contact springs 11 and 12 firmly and conductively joined to the upper fixed contacts 5 and 6, respectively, preferably by welding.

The fixed contacts 7, 8 and 9, 10 are positioned to intercept the free ends 13*a* and 13*b* of the contact springs 11 and 12, respectively, and form contact pairs with the contact pads 14 of the contact springs 11 and 12, respectively. Four of contact pads 14 are used, with two of pads 14 mounted on each of the free ends 13*a* and 13*b*, respectively. The contact pads 14 are preferably contacts that may be replaced after wear during use.

The contact springs 11 and 12 are pretensioned and biased inwardly so that their inner contacts 14 reliably press against the inner fixed contacts 8 and 9, respectively, so that spring 11 with contact 8, and spring 12 with contact 9 each forms a normally closed switch. During use, springs 11 and 12 are moved back and forth as a rotary shaft 27 rotates and turns a toothed disk 16 coupled to the shaft 27. Thus electrical contact closure pulses are generated at the contacts 7, 8, 9 and 10 using power from an external power supply (not shown) as the shaft 27 turns.

Between the contact springs 11 and 12, which are spaced apart and approximately parallel to each other, a toothed disk 16 which is rotatable about its axis 15, and a preferably plate-shaped rocker 18 which is mounted to swivel about a swivel shaft 17 are arranged in such a manner that the imaginary center or connecting line 19 between the axis 15 and the swivel shaft 17 is approximately parallel to the contact springs 11 and 12.

For mounting on the swivel shaft 17, the rocker 18 has an oblong bearing hole 20 which is elongated. The elongation of the hole 20 is made to extend in the direction of the center line 19 when the rocker 18 is in place in its rest position, as further explained below.

In the rest position, a toothlike projection, or tooth crown, of the rocker 18, which serves as a mating portion 21, engages an opposite tooth space, or tooth root, of the toothed disk 16. In this design with an oblong hole 20, the rest position is maintained by a compression spring 23 which forces the rocker 18 against the toothed disk 16. The compression spring is preferably designed as a bar or a leaf spring and presses on the outside 24 of the rocker 18 opposite the mating portion 21. Preferably, the outside 24 is designed either in a flat, straight line or is convex, curved towards the inside, so that two lateral outside edges 25 and 26 are formed which rest against the compression spring 23. Thus, the position of the rocker 18 is maintained in a stable rest position; and it can be swiveled back to the rest position after being deflected by the toothed disk 16 as a result of the force of the compression spring 23 after the rotary shaft 27 has been released. Simultaneously, the toothed disk 16 and the rotary shaft 27 are also maintained in a stable rest position. Instead of this detent arrangement, a device such as a ball detent (not shown) may be provided to maintain the toothed disk 16 in a rest position.

Projecting arms 28 are intergally formed with the rocker 18 which, when the rocker 18 is deflected by the toothed disk 16, come to a stop at one of the contact springs 11 or 12, in particular in a portion 11*a* or 12*a* between their points of attachment (contacts 5 or 6) and the fixed contacts 7, 8 or 9, 10 and which are capable of actuating the latter so as to open the inner contact pair 14, 8 or 14, 9 and to close the outer contact pair 14, 7 or 14, 10 prior to the return to the next tooth space 29. As the rocker 18 jumps back, the contacts return to their normal position. This switching behavior is ensured by the oblong hole 20, which allows such a jump back or sliding motion of rocker 18. The jump-back movement can be supported by the provision of limit stops which prevent the rocker 18 from continuing its swiveling motion and instead cause a displacement of the rocker 18 in the respective direction of the oblong hole 20, indicated by the dashed arrow 30, when the toothed disk 16 continues to rotate. Thus, the mating portion disengages the moving tooth which slides over the inclined flanks 31 of the mating portion 21. The latter can then engage the next tooth space 29, while the rocker 18 is moved upwards.

In both embodiments, the inner fixed contacts 8 and 9 serve as limit stops, which is achieved by positioning the same and shaping the sidewalls 32 of the rocker 18 in a suitable manner to intercept the contacts 8 and 9 at the extreme limits of the swiveling movement of rocker 18.

Figure 3:
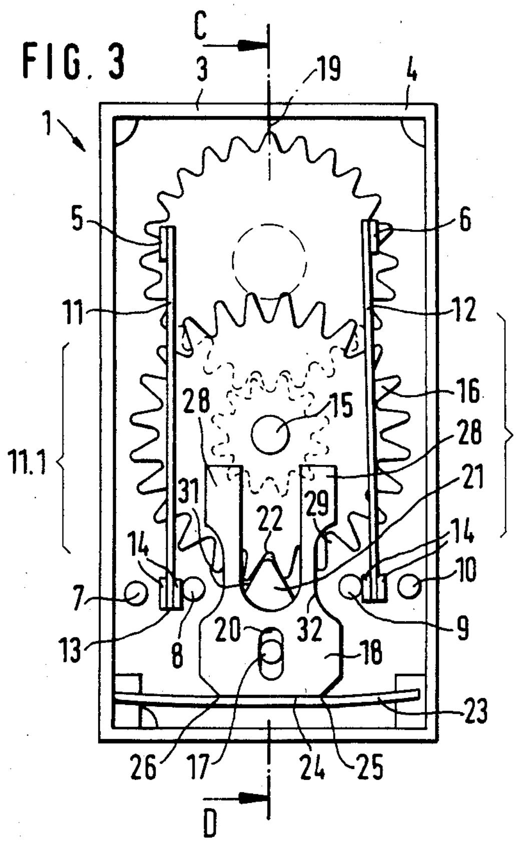
FIG. 3 shows an alternative embodiment with transmission gears.
Figure 4:
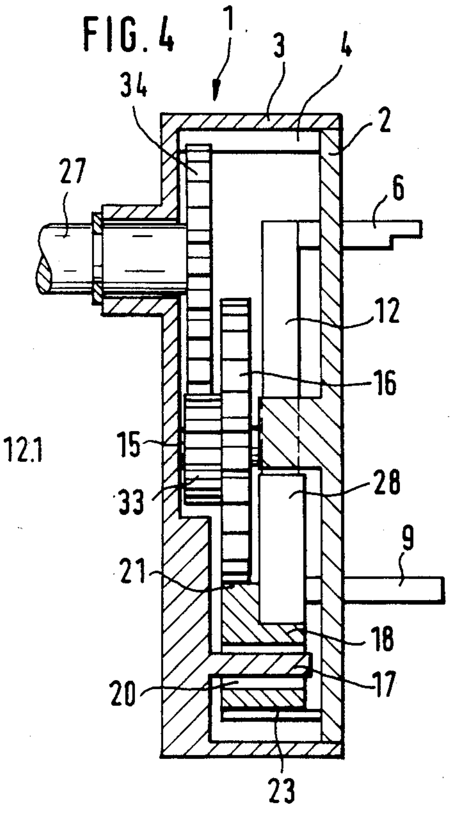
FIG. 4 is a section taken along line C-D of FIG. 3, but without a section through the transmission gears.

In accordance with the alternative embodiment shown in FIGS. 3 and 4, the contact springs 11 and 12 may be located either above or below the toothed disk 16, with the rocker 18 acting in two planes as the mating portion 21 is located in the plane of the toothed disk 16 and the arms 28 in the plane of the contact springs 11 and 12. A transmission gearing is additionally provided in this embodiment. It has a pinion 33 which is either rigidly coupled to the toothed disk 16 or forms a structural unit therewith, a gear 34 meshing with the pinion 33. The gear 34 can be driven via the rotary shaft 27.

What is claimed is:

1. A pulse generator for producing electrical contact closure pulses in response to the rotation of a rotary shaft, said pulse generator comprising:

a generator body on which the rotary shaft is rotatably mounted, wherein the body has a swivel shaft mounted thereon;

a toothed disk coupled to said rotary shaft to rotate therewith, said disk having a plurality of teeth on the periphery thereof, and having spaces between each of said teeth;

a rocker of a solid, single-piece construction with an elongated, oblong bearing hole therethrough adapted to fit over said swivel shaft and allowing the rocker to deflect by rotating on said swivel shaft, said rocker further having a mating portion thereon for engaging the teeth of a toothed disk, said rocker being deflectable in at least two different directions in response to the rotation of said toothed disk by said rotary shaft;

wherein the mating portion of the disk is movable out of engagement with one of said tooth spaces and into engagement with the next adjacent tooth space as the rocker is deflected in response to rotation of said toothed disk;

a pair of contact springs mounted to apply spring forces to said rocker, wherein said contact springs apply spring forces to the rocker, when the contact springs are deflected by deflection or the rocker due to rotation of the disk;

wherein said contact springs are mounted adjacent said rotary shaft on said generator body, said contact springs being aligned with an imaginary line connecting the rotary shaft and the swivel shaft;

wherein said rocker has lateral actuating arms mounted thereon and positioned to fit against said contact springs; and a detent means for resiliently holding the rocker in a rest position when both of said contact springs are undeflected, said detent means comprising a compression spring in the form of a leaf spring for contact with outside lateral edges of said rocker, said lateral edges being symmetrically disposed on opposite sides of the bearing hole and being in contact with the compression spring in the rest position of the rocker and shaped to cooperate with the spring to urge the rocker into said rest position.

2. The pulse generator of claim 1 wherein said compressioin spring is mounted on said body and positioned to apply spring force against said rocker in the direction of said swivel shaft and along an imaginary line connecting said rotary shaft and said swivel shaft, so as to spring bias said rocker for sliding motion in said oblong hole, and causing said rocker to jump back when deflected from its rest position.

3. The pulse generator of claim 1 wherein said detent means comprises a compression spring mounted on said generator body to apply a detent force to said rocker in the direction of said swivel shaft.

4. The pulse generator of claim 1 further comprising a limit stop providing boundaries for the deflection of said rocker.

5. The pulse generator of claim 4 wherein said limit stop further is positioned to displace said rocker in a direction along the length of said oblong hole when the rocker contacts the limit stop.

6. The pulse generator of claim 5 wherein said limit stop comprises a contact pin.

7. The pulse generator of claim 1 further comprising a limit stop providing boundaries for the deflection of said rocker.

8. The pulse generator of claim 7 wherein said limit stop comprises a contact pin.

9. The pulse generator of claim 1 wherein:

said mating portion includes inclined flanks for engaging a tooth space, and said detent means is adapted to produce a force which is large enough to prevent stray motion of said rocker, and said force being small enough so that said rocker may be displaced to a sufficient extent such that the mating portion is moved to engage adjacent tooth spaces in sequence as said rotary shaft rotates.

10. The pulse generator of claim 1 wherein said generator body comprises:

a bottom member having said contact pairs and said contact springs mounted thereon; and a cover member having said toothed disk, said rocker, and said detent means mounted thereon.

11. The pulse generator of claim 10 wherein said bottom member and said cover member interfit tightly to form a totally enclosed housing capable of being tightly sealed.

12. The pulse generator of claim 1 wherein said lateral actuating arms of the rocker are positioned to actuate the contact springs midway along the length of each of said contact springs.

13. The pulse generator of claim 1 further comprising:

a pinion attached to said toothed disk; and a gear attached to the rotary shaft and positioned to couple with said pinion in order to transfer rotation from said rotary shaft to said pinion and said toothed disk.

14. The pulse generator of claim 13 wherein said contact springs are positioned adjacent said toothed disk, and on the side of said disk opposite said pinion.

15. The pulse generator of claim 1 wherein said rocker is a flat plate with said actuating arms extending therefrom, and wherein said rocker is capable of being deflected by being swiveled about an axis perpendicular to the plane of said plate.

16. The pulse generator of claim 1 wherein said mating portion of said rocker is co-planar with said toothed disk, and wherein said contact springs are vertically displaced from the plane of said toothed disk, and wherein said actuating arms are co-planar with said contact springs.

* * * * *

UNITED STATES PATENT AND TRADEMARK OFFICE
CERTIFICATE OF CORRECTION

PATENT NO. : 4,801,814
DATED : January 31, 1989
INVENTOR(S) : J. Rose; W. Rosl

It is certified that error appears in the above-identified patent and that said Letters Patent is hereby corrected as shown below:

In the Specification:

Column 1, line 67, change "intergrally" to -- integrally --.

Column 2, line 13, change "againt" to -- against --.
Column 2, line 58, change "intergally" to -- integrally --.

Signed and Sealed this
Twenty-first Day of November, 1989

*Attest:*

JEFFREY M. SAMUELS

*Attesting Officer* *Acting Commissioner of Patents and Trademarks*